United States Patent
Kim et al.

(10) Patent No.: US 6,753,265 B2
(45) Date of Patent: Jun. 22, 2004

(54) METHOD FOR MANUFACTURING BIT LINE

(75) Inventors: Jun Dong Kim, Seoul (KR); Kyung Won Lee, Seoul (KR)

(73) Assignee: Hynix Semiconductor Inc., Ich'on (KR)

(*) Notice: Subject to any disclaimer, the term of this patent is extended or adjusted under 35 U.S.C. 154(b) by 0 days.

(21) Appl. No.: 10/067,265

(22) Filed: Feb. 7, 2002

(65) Prior Publication Data

US 2003/0049926 A1 Mar. 13, 2003

(30) Foreign Application Priority Data

Sep. 13, 2001 (KR) .......................................... 2001-56515

(51) Int. Cl.⁷ ..................... H01L 21/302; H01L 21/461
(52) U.S. Cl. ..................................................... 438/717
(58) Field of Search ................................ 216/41, 47, 51; 430/312, 313; 438/706, 707, 711, 717, 721–726

(56) References Cited

U.S. PATENT DOCUMENTS

| | | | |
|---|---|---|---|
| 4,495,220 A | 1/1985 | Wolf et al. | |
| 5,087,535 A | 2/1992 | Hirokane et al. | |
| 5,256,248 A | 10/1993 | Jun | |
| 5,286,674 A | 2/1994 | Roth et al. | |
| 5,880,035 A | 3/1999 | Fukuda | |
| 6,008,131 A | 12/1999 | Chen | |
| 6,150,263 A * | 11/2000 | Lin et al. | 438/652 |
| 6,184,081 B1 | 2/2001 | Jeng et al. | |
| 6,458,284 B1 * | 10/2002 | Kashihara | 216/47 |
| 2002/0187434 A1 * | 12/2002 | Blatchford et al. | 430/322 |

FOREIGN PATENT DOCUMENTS

| | | | | |
|---|---|---|---|---|
| JP | 08-321484 | 12/1996 | ....... | H01L/21/3065 |
| JP | 09-082797 | 3/1997 | ......... | H01L/21/768 |

OTHER PUBLICATIONS

Wolf and Tauber, "Silicon processing for the VLSI Era, vol. 1", Chapter 16, p 539, Lattice Press, CA (1986).*

* cited by examiner

*Primary Examiner*—Evan Pert
*Assistant Examiner*—Asok Kumar Sarkar
(74) *Attorney, Agent, or Firm*—Jacobson Holman PLLC

(57) ABSTRACT

Disclosed is a bit line-manufacturing method, by which a bit line having a fine width can be easily manufactured. The method comprises the steps of: successively forming a conducting layer and an insulating layer on a substrate, the conducting layer serving to form a bit line; forming a first mask pattern on the insulating layer in such a manner that a desired region of the insulating layer is exposed; etching the first mask pattern, so as to form a second mask pattern; removing the insulating layer using the second mask pattern; removing the second mask pattern; and removing the conducting layer using the remaining insulating layer as a mask, so as to form the bit line.

12 Claims, 6 Drawing Sheets

METHOD FOR MANUFACTURING BIT LINE

BACKGROUND OF THE INVENTION

1. Field of the Invention

The present invention relates generally to a method of fabricating a semiconductor device, and more particularly to a bit line-manufacturing method, by which a bit line having a fine width can be manufactured in an easy manner.

2. Description of the Prior Art

As generally known in the art, due to the trend to make semiconductor devices highly integrated, the size of the circuit linewidth in the semiconductor device has gradually decreased. In particular, in order to ensure a process margin in a self-align contact process and in a following process of depositing an interlayer-insulating layer for electrical insulation from a conducting layer (e.g., storage node electrode of capacitor) after the bit line is formed, a bit line circuit width of less than 0.1 μm is required in products at a level of at least 1 GIGA DRAM.

However, it is actually difficult to form a bit line having such a fine width by means of the existing photo equipment. Also, in order to form a bit line having a width of less than 0.1 μm, is a photo masking process is currently carried out using an electron beam. However, this process has a problem of low productivity.

FIGS. 1A to 1C are cross-sectional views showing a method for fabricating a bit line according to the prior art.

According to the conventional bit line-manufacturing method as shown in FIG. 1A, a conducting layer 102 for forming the bit line and an insulating layer 104 are successively formed on a semiconductor substrate 100. In this case, the insulating layer 104 serves as a hard mask while the subsequent process for forming the bit line progresses. Further, although not shown, the semiconductor substrate 100 has a structure where a transistor having a source/drain electrode region and a gate is formed.

Thereafter, a photoresist film is applied on the insulating layer 104, exposed to light, and then developed, so that a photoresist pattern 108 covering a region, in which the bit line is formed, is formed. When conventional photo equipment is used, the photoresist pattern 108 is so patterned as to have a width of at least about 0.14 μm.

Next, as shown in FIG. 1B, the insulating layer is removed using the photoresist pattern as an etching mask, to thereby form a hard mask 105. In this case, the removal of the insulating layer is carried out according to a first anisotropic dry etching process 112.

Thereafter, the photoresist pattern is removed, and then the remnant is covered by the hard mask 105, as shown in FIG. 1C. Thereafter, the conducting layer is etched according to a second anisotropic dry etching process 114, to thereby form a bit line 103.

At this time, the bit line 103 is formed of a conducting layer remaining after the second anisotropic dry etching process, and is so patterned as to have a width of about 0.14 μm equal to that of the mask pattern.

In highly-integrated devices having a linewidth of less than 0.14 μm, however, the height of a conducting layer for forming the bit line is relatively increased due to a resistance problem of the conducting layer, whereas line and space are reduced.

Also, in the case of the bit line, in order to form a self-align contact and a contact for a storage node electrode of a capacitor in the subsequent process, an additional insulating layer for forming the hard mask is formed on the conducting layer for forming the bit line. For this reason, the height of the bit line has to be further increased.

Due to such a relative reduction of space and such a relative increase of the height of the conducting layer as described above, it is difficult to deposit the insulating film for forming the hard mask in order to insulate the bit line from the storage node electrode.

In the case where the bit line is so manufactured as to have a width of less than 0.1 μm narrower than 0.14 μm according to the conventional method, various problems occur in the course of the progress of the subsequent processes including a depositing process of the interlayer insulating film for electrical insulation between the bit line and the conducting layer and a self-align contact process. In other words, as shown in FIGS. 2A to 2C and FIG. 3, the hard mask for forming the bit line may be damaged or broken down due to poor gap-fill of the interlayer insulating film. Also, bridges may be caused between the storage node electrodes to be formed in the subsequent processes. In addition, a contact margin may not be ensured, so that the self-align contact cannot be opened.

SUMMARY OF THE INVENTION

Accordingly, the present invention has been made to solve the above-mentioned problems occurring in the prior art, and an object of the present invention is to provide a bit line-manufacturing method, by which a bit line having a fine width of less than 0.1 μm can be easily manufactured.

To accomplish this object, there is provided a method of manufacturing a bit line, which comprises: successively forming a conducting layer and a hard mask on a substrate, the conducting layer serving to form a bit line,; forming a first mask pattern on the hard mask in such a manner that a sea desired region of the hard mask is exposed; isotropic dry etching the first mask pattern, so as to form a second mask pattern; etching the hard mask using the second mask pattern; removing the second mask pattern; and etching the conducting layer using the remaining hard mask, so as to form the bit line.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described in detail with reference to the accompanying drawings.

FIGS. 4A to 4D are cross-sectional views showing a B method of manufacturing a bit line according to the present invention.

Figure 1A:
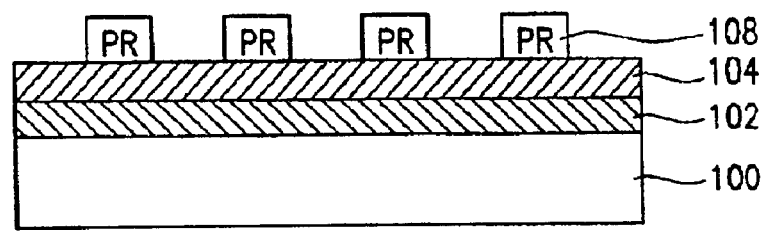
FIGS. 1A to 1C are cross-sectional views showing a method of manufacturing a bit line according to the prior art.
Figure 1B:
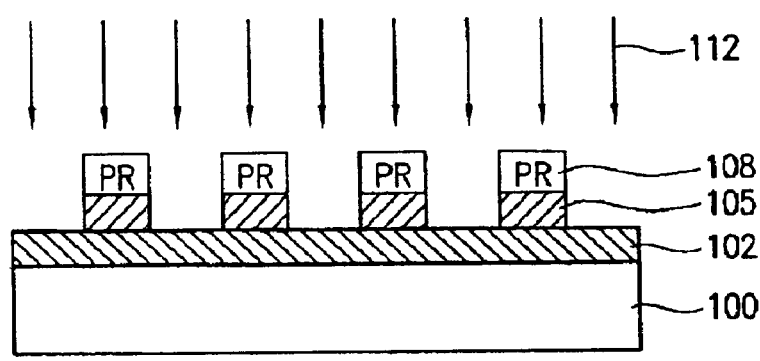
Figure 1C:
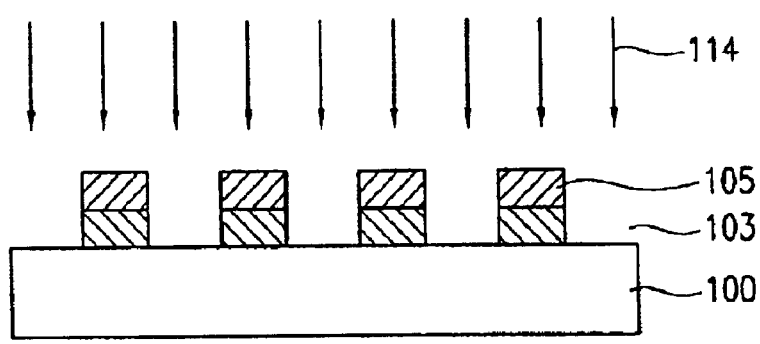
Figure 2A:
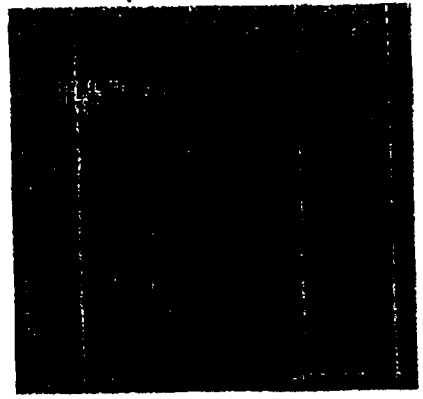
FIGS. 2A to 2C and FIG. 3 show problems occurring in the prior art.
Figure 2B:
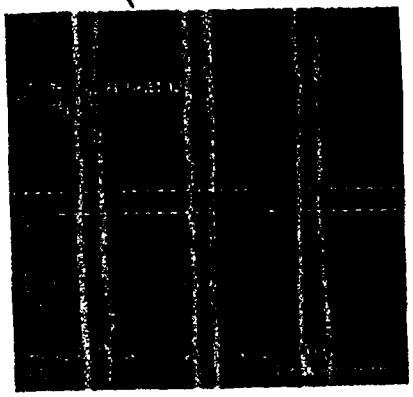
Figure 2C:
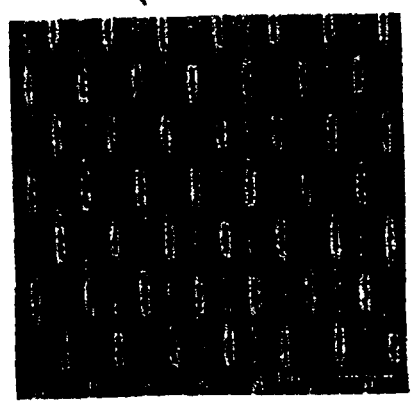
Figure 3:
Figure 4A:
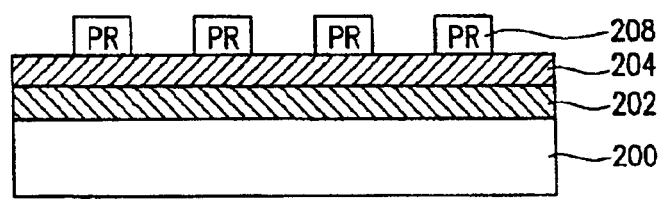
FIGS. 4A to 4D are cross-sectional views showing a method of manufacturing a bit line according to the present invention.

In the bit line-manufacturing method according to the present invention, a conducting layer 202 for forming the bit line and an insulating layer 204 for forming a hard mask are successively formed on a semiconductor substrate 200 where a transistor has been formed, as shown in FIG. 4A.

In this case, the conducting layer 202 is made from a conducting substance such as tungsten (W) or tungsten silicide ($WSi_x$), etc., and the insulating layer is formed of an oxide film or a nitride film.

Thereafter, a photoresist film is applied on the insulating layer 204, is exposed to light, and then is developed, so that a first photoresist pattern 208 exposing a desired region of the insulating layer 204 is formed. The first photoresist pattern 208 is so patterned as to have a width of at least 0.14 μm when the existing photo equipment is used.

Figure 4B:
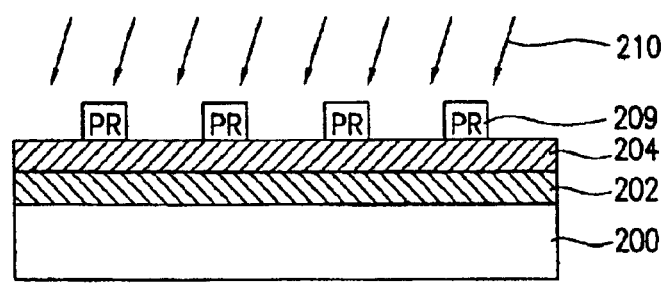

Next, as shown in FIG. 4b, the first photoresist pattern 208 is partially removed by an isotropic dry etching process 210, so as to form a second photoresist pattern 209 having a width narrower than that of the first photoresist pattern 208.

The isotropic dry etching process 210 is carried out by supplying oxygen gas to plasma dry etching equipment which uses microwaves as an energy source. The oxygen gas is supplied at a flow rate of 800 sccm, preferably at a flow rate of 350 to 450 sccm.

Also, the microwaves are applied with a power of less than 400 Watts, preferably less than 200 to 300 Watts. The dry etching equipment is used at a pressure of 600 to 1,000 mT, and the first photoresist pattern is etched at a rate of 3000 Å thickness per minute.

As a result of the isotropic dry etching process, the second photoresist pattern 209 is so patterned as to have a width of less than 0.1 μm.

Figure 4C:
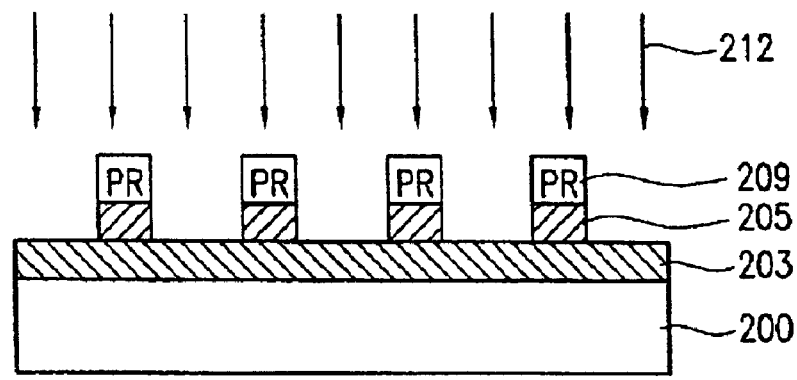

Next, as shown in FIG. 4C, the insulating layer is subjected to a first anisotropic dry etching process 212 using the second photoresist pattern 209 as a mask, so as to form a hard mask 205. The hard mask 205 is an insulating layer remaining after the first etching process 212 and serves as an etching mask in the subsequent process of patterning a bit line.

Figure 4D:
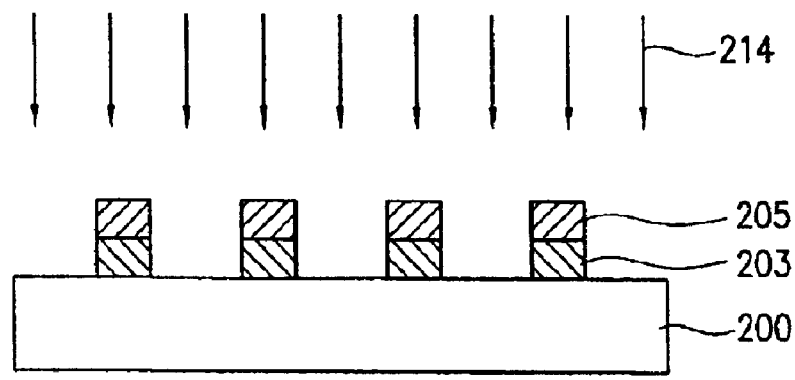

As shown in FIG. 4D, after the second photoresist pattern is removed, the conducting layer is etched using the covered hard mask 205, to thereby form a bit line 203. In this case, the process of etching the conducting layer is carried out according to a second anisotropic etching process 214.

The bit line is formed of the conducting layer remaining after the second etching process 214 and is so patterned as to have the same shape as that of the second photoresist pattern. Thus, the bit line has a width of 0.1 μm equal to that of the second photoresist pattern.

Figure 5:
FIG. 5 is a cross-sectional view showing a bit line manufactured according to the present invention.

As described above, in the method of the present invention, the first photoresist pattern having a linewidth of 0.14 μm is subjected to an isotropic dry etching process by means of the plasma dry etching equipment using a microwave energy source, so that the second photoresist pattern having a width of less than 0.1 μm is formed. Also, using the second photoresist pattern, the bit line having a width of less than 0.1 μm can be formed, as shown in FIG. 5.

The isotropic dry etching process 210 is carried out under such circumstances that a cathode (not shown) is maintained at a temperature of not higher than 100° C. and oxygen ($O_2$) gas is used as the main etching gas.

The oxygen gas used in the etching process 210 is maintained at a flow rate of 800 sccm. Moreover, $CF_4$ gas at a flow rate of not more than 50 sccm may also be added according to circumstances. In this case, the oxygen gas is maintained at a flow rate of 350 to 450 sccm. In addition, the microwaves are applied at a low power less than 400 Watts, and the dry etching equipment is adjusted to be at a pressure of 600 to 1,000 mT.

Where the dry etching process is carried out using such processing conditions as above, the isotropic etching progresses so that the width of the bit line can be adjusted up to less than 0.1 μm.

As apparent from the foregoing, the method of the present invention provides a bit line having a fine width of less than 0.1 μm. Therefore, when an interlayer insulating film for insulation between the conducting layer and the bit line is deposited in the subsequent process, a poor gap-fill in the interlayer insulating film can be prevented. In addition, a process margin can be ensured in a self-align contact process, and thus the reliability of the device can be ensured.

Moreover, in the method of the present invention, a bit line with a width of less than 0.1 μm can be manufactured using the usual dry etching equipment using microwave power. Therefore, it is possible to reduce production costs, which may otherwise be incurred due to the addition of new dry etching equipment, and it is also possible to produce a highly integrated device.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method of manufacturing a bit line, the method comprising the steps of:
   successively forming a conducting layer and an insulating layer on a substrate, the conducting layer serving to form a bit line;
   forming a photoresist film on the insulating layer;
   etching the photoresist film using a photolithography process so as to form a first mask pattern on the insulating layer in such a manner that a desired region of the insulating layer is exposed;
   etching the first mask pattern by an isotropic dry etching so as to form a second mask pattern, wherein the isotropic dry etching is carried out with plasma dry etching equipment, which uses a microwave energy source;
   removing the insulating layer by a first anisotropic dry etching using the second mask pattern;
   removing the second mask pattern; and
   etching the conducting layer by a second anisotropic dry etching using the remaining insulating layer, so as to form the bit line.

2. The method as claimed in claim 1, wherein the isotropic dry etching is carried out while oxygen gas is supplied.

3. The method as claimed in claim 2, wherein the isotropic dry etching is carried out while $CF_4$ gas is supplied, in addition to the oxygen gas.

4. The method as claimed in claim 2, wherein the oxygen gas is supplied at a flow rate of 350 to 450 sccm.

5. The method as claimed in claim 2, wherein the oxygen gas is supplied at a flow rate of 800 sccm.

6. The method as claimed in claim 1, wherein the isotropic dry etching is carried out using a source of power of less than 400 Watts.

7. The method as claimed in claim 1, wherein the isotropic dry etching is carried out using a source of power of 200 to 300 Watts.

8. The method as claimed in claim 1, wherein the isotropic dry etching is carried out using a pressure of 600 to 1000 mT.

9. The method as claimed in claim 1, wherein in the step of successively forming the conducting layer and the insulating layer, the insulating layer is formed of an oxide film or a nitride film.

10. The method as claimed in claim 1, wherein in the step of successively forming the conducting layer and the insulating layer, the conducting layer is made from a material selected from the group consisting of tungsten and tungsten silicide.

11. The method as claimed in claim 1, wherein the step of etching the first mask pattern to form the second mask pattern is carried out by etching the first mask pattern at an etching rate of less than 3000 Å thickness per minute.

12. A method of manufacturing a bit line having a width of not more than 0.1 $\mu$m, the method comprising the steps of:

successively forming a conducting layer and an insulating layer on a substrate;

forming a photoresist film on the insulating layer;

patterning the photoresist film using a photolithography process such that a desired region of the insulating layer is exposed to form a first photoresist pattern having a width of at least 0.14 $\mu$m;

partially removing the first photoresist pattern by an isotropic dry etching process using plasma dry etching equipment so as to form a second photoresist pattern having a width of not more than 0.1 $\mu$m, said isotropic dry etching process being carried out by supplying oxygen gas at a flow rate of approximately 800 sccm, using a microwave energy source having a power less than 400 Watts and at a pressure of approximately 600 to 1,000 mT;

removing a portion of said insulating layer by a first anisotropic dry etching using the second photoresist pattern as a mask, a remaining portion of said insulating layer forming a hard mask;

removing the second photoresist pattern; and etching the conducting layer by a second anisotropic dry etching using the hard mask so as to form the bit line, said bit line having a same shape as said second photoresist pattern such that said bit line has a width of not more than 0.1 $\mu$m.

* * * * *